(12) United States Patent
Park et al.

(10) Patent No.: US 8,698,159 B2
(45) Date of Patent: Apr. 15, 2014

(54) PANEL STRUCTURE INCLUDING TRANSISTOR AND CONNECTING ELEMENTS, DISPLAY DEVICE INCLUDING SAME, AND METHODS OF MANUFACTURING PANEL STRUCTURE AND DISPLAY DEVICE

(71) Applicant: Samsung Electronics Co., Ltd., Suwon-si (KR)

(72) Inventors: Kyung-bae Park, Seoul (KR); Myung-kwan Ryu, Yongin-si (KR); Kee-chan Park, Anyang-si (KR); Jong-baek Seon, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/621,531

(22) Filed: Sep. 17, 2012

(65) Prior Publication Data
US 2013/0015454 A1   Jan. 17, 2013

Related U.S. Application Data

(62) Division of application No. 12/588,247, filed on Oct. 8, 2009, now Pat. No. 8,294,150.

(30) Foreign Application Priority Data

Oct. 17, 2008  (KR) .................. 10-2008-0102151

(51) Int. Cl.
*H01L 29/04* (2006.01)
*H01L 29/15* (2006.01)
*H01L 31/036* (2006.01)
*H01L 29/10* (2006.01)
*H01L 31/0376* (2006.01)
*H01L 31/20* (2006.01)
*H01L 31/062* (2012.01)
*H01L 31/113* (2006.01)

(52) U.S. Cl.
USPC ......... 257/72; 257/59; 257/291; 257/E33.066

(58) Field of Classification Search
USPC ................ 257/59, 72, 291, E33.066
See application file for complete search history.

(56) References Cited

U.S. PATENT DOCUMENTS 6,124,606 A    9/2000  den Boer et al.
6,480,577 B1 * 11/2002 Izumi et al. .................... 379/40

(Continued)

FOREIGN PATENT DOCUMENTS

JP   2007052102 A   3/2007
JP   2007219517 A   8/2007

(Continued)

OTHER PUBLICATIONS

Japanese Office Action issued in Japanese Application No. 2009-238280, dated Nov. 26, 2013.

*Primary Examiner* — Ida M Soward
(74) *Attorney, Agent, or Firm* — Harness, Dickey & Pierce, P.L.C.

(57) ABSTRACT

A panel structure includes a transistor including a gate electrode, a source electrode and a drain electrode, a power source line, a pixel electrode, and one or more contact plugs formed of a same material as the pixel electrode and electrically connecting the power source line and the source electrode.

5 Claims, 9 Drawing Sheets

(56) References Cited

U.S. PATENT DOCUMENTS

| | | | |
|---|---|---|---|
| 6,534,788 B1 | 3/2003 | Yeo et al. | |
| 6,703,992 B1 * | 3/2004 | Yamada | 345/76 |
| 6,750,836 B1 * | 6/2004 | Katayama et al. | 345/92 |
| 6,861,302 B2 | 3/2005 | Dai | |
| 6,897,907 B2 * | 5/2005 | Morimitsu | 349/42 |
| 6,958,740 B1 * | 10/2005 | Nishikawa | 345/76 |
| 7,038,241 B2 | 5/2006 | Okumura | |
| 7,330,222 B2 * | 2/2008 | Shiraki et al. | 349/54 |
| 7,372,513 B2 | 5/2008 | Choi | |
| 7,394,446 B2 * | 7/2008 | Park | 345/92 |
| 7,417,251 B2 * | 8/2008 | Iketsu et al. | 257/72 |
| 7,460,094 B2 * | 12/2008 | Ozawa | 345/82 |
| 7,550,772 B2 | 6/2009 | Toyota et al. | |
| 7,586,197 B2 | 9/2009 | Lee et al. | |
| 7,800,725 B2 | 9/2010 | Na et al. | |
| 7,804,552 B2 | 9/2010 | Yamazaki et al. | |
| 7,834,947 B2 | 11/2010 | Jun et al. | |
| 7,842,538 B2 | 11/2010 | Lee et al. | |
| 7,863,602 B2 | 1/2011 | Huh et al. | |
| 7,888,148 B2 | 2/2011 | Park et al. | |
| 8,023,055 B2 | 9/2011 | Nakajima et al. | |
| 8,093,801 B2 | 1/2012 | Yamada et al. | |
| 8,228,273 B2 * | 7/2012 | Tsubata | 345/87 |
| 2001/0045995 A1 * | 11/2001 | Numano et al. | 349/38 |
| 2002/0105614 A1 * | 8/2002 | Nakayama et al. | 349/143 |
| 2002/0118318 A1 * | 8/2002 | Hidehira et al. | 349/43 |
| 2003/0038910 A1 * | 2/2003 | Nagano et al. | 349/113 |
| 2005/0146654 A1 | 7/2005 | Tseng | |
| 2005/0195345 A1 | 9/2005 | Chiang et al. | |
| 2005/0282303 A1 * | 12/2005 | Ahn | 438/22 |
| 2006/0072059 A1 | 4/2006 | Yamazaki et al. | |
| 2006/0097262 A1 | 5/2006 | Kim et al. | |
| 2006/0108916 A1 | 5/2006 | Koo et al. | |
| 2006/0169981 A1 * | 8/2006 | Joo | 257/66 |
| 2006/0250548 A1 * | 11/2006 | Yasukawa | 349/113 |
| 2007/0019146 A1 * | 1/2007 | Yamazaki et al. | 349/151 |
| 2007/0176176 A1 * | 8/2007 | Yamazaki et al. | 257/59 |
| 2008/0013007 A1 | 1/2008 | Yokoyama et al. | |
| 2008/0042139 A1 | 2/2008 | Huh et al. | |
| 2008/0079005 A1 | 4/2008 | Tseng | |
| 2008/0111475 A1 * | 5/2008 | Baek et al. | 313/504 |
| 2008/0116457 A1 | 5/2008 | Park et al. | |
| 2008/0230768 A1 | 9/2008 | Goh | |
| 2008/0258196 A1 | 10/2008 | Chen | |
| 2008/0308810 A1 | 12/2008 | Akimoto | |
| 2009/0278121 A1 | 11/2009 | Kakkad et al. | |
| 2012/0236226 A1 * | 9/2012 | Noda et al. | 349/54 |
| 2012/0248448 A1 * | 10/2012 | Sakakura et al. | 257/59 |
| 2013/0214280 A1 * | 8/2013 | Sato | 257/59 |
| 2013/0248892 A1 * | 9/2013 | Osame et al. | 257/88 |

FOREIGN PATENT DOCUMENTS

| | | |
|---|---|---|
| JP | 2007316110 A | 12/2007 |
| KR | 10-2002-0043860 | 6/2002 |
| KR | 10-2006-0132163 | 12/2006 |
| KR | 10-2008-0050679 | 6/2008 |
| KR | 10-2008-0053541 | 6/2008 |
| KR | 2008-0053646 A | 6/2008 |

* cited by examiner

PANEL STRUCTURE INCLUDING TRANSISTOR AND CONNECTING ELEMENTS, DISPLAY DEVICE INCLUDING SAME, AND METHODS OF MANUFACTURING PANEL STRUCTURE AND DISPLAY DEVICE

CROSS-REFERENCE TO RELATED APPLICATION

This application is a divisional application of U.S. application Ser. No. 12/588,247, filed on Oct. 8, 2009, which claims priority under 35 U.S.C. §119 to Korean Patent Application No. 10-2008-0102151, filed on Oct. 17, 2008, in the Korean Intellectual Property Office (KIPO), the entire contents of each of which are incorporated herein by reference.

BACKGROUND

1. Field

Example embodiments relate to a panel structure, a display device including the panel structure and methods of manufacturing the panel structure and the display device.

2. Description of the Related Art

Thin film transistors (TFTs) may be used for various purposes in a wide range of electronic device fields. In particular, because the thin film transistors may be easily manufactured not only on a silicon substrate but also on a glass substrate or a plastic substrate, TFTs may be applied to various flat panel display devices. TFTs may be divided into a top-gate TFT, in which a gate may be disposed above a channel layer, and a bottom-gate TFT, in which a gate may be disposed below a channel layer.

The bottom-gate TFT may have an advantage over the top-gate TFT, in terms of manufacturability, because the number of masks used in manufacturing the bottom-gate TFT may be smaller than the number of masks used in manufacturing the top-gate TFT. The use of a smaller number of masks denotes that a manufacturing process may be simpler and the cost of manufacturing may be relatively lower. However, six or more masks may be used to manufacture conventional existing bottom-gate TFTs. In particular, via holes for vertical interconnection may be formed through at least two mask processes.

SUMMARY

Example embodiments may include a panel structure including a bottom-gate thin film transistor (TFT). Example embodiments may include a display device including the panel structure. Example embodiments may include methods of manufacturing the panel structure and the display device.

Additional aspects will be set forth in part in the description which follows and, in part, will be apparent from the description, or may be learned by practice of example embodiments.

According to example embodiments, a panel structure may include a first thin film transistor (TFT) including a first gate electrode, a first active layer, a first source electrode contacting the first active layer and a first drain electrode contacting the first active layer; a first conductive layer disposed apart from the first drain electrode; a pixel electrode; a first connection wire formed of a same material as the pixel electrode and disposed apart from the pixel electrode, the first connection wire including a first end and a second end; a first conductive plug connecting the first drain electrode and the first end of the first connection wire; and a second conductive plug connecting the second end of the first connection wire and the first conductive layer.

The first connection wire and the pixel electrode may include at least one of a metal oxide and a metal, and the metal oxide may be any one of indium tin oxide (ITO), indium zinc oxide (IZO), Sn oxide, In oxide, Zn oxide, and a mixture thereof.

The panel structure may further include a gate insulating layer covering the first conductive layer; and an insulating layer on the gate insulating layer covering the first drain electrode, and wherein the first connection wire may be on the insulating layer, the first conductive plug may penetrate the insulating layer, and the second conductive plug may penetrate the gate insulating layer and the insulating layer.

The panel structure may further include a second conductive layer spaced apart from the first conductive layer; a third conductive layer spaced apart from the second conductive layer; and a second connection wire formed of the same material as the first connection wire and the pixel electrode, the second connection wire including a first end connected to the second conductive layer and a second end connected to the third conductive layer. The second conductive layer may be a power source line.

The first conductive layer may be a second gate electrode and the third conductive layer may be a second source electrode, and the panel structure may further include a gate insulating layer covering the first gate electrode and the second gate electrode; a second active layer on the gate insulating layer; a second drain electrode contacting the second active layer; and an insulating layer on the gate insulating layer covering the first active layer, the first source electrode, the first drain electrode, the second active layer, the second source electrode, and the second drain electrode. At least a portion of the second gate electrode may be deposed between the first gate electrode and the second conductive layer. The gate insulating layer may cover the second conductive layer, and the second connection wire may be on the insulating layer formed on the second conductive layer.

The second source electrode may extend over the second conductive layer, and the panel structure may further include a third conductive plug connecting the first end of the second connection wire to the second conductive layer by penetrating the gate insulating layer and the insulating layer, and a fourth conductive plug connecting the second end of the second connection wire to the second source electrode by penetrating the insulating layer. The pixel electrode may be formed on the insulating layer and connected to the second drain electrode. The pixel electrode may be formed on the insulating layer between the second gate electrode and the second conductive layer.

The second gate electrode, the second active layer, the second source electrode, and the second drain electrode may form a second TFT. The first TFT may be a switching transistor, and the second TFT may be a driving transistor. A part of the second gate electrode, a part of the second source electrode corresponding to the part of the second gate electrode, and the gate insulating layer therebetween may operate as a capacitor.

The first active layer may be formed of at least one of amorphous silicon (a-Si), poly-crystalline silicon (poly-Si), GeSi, GaAs, and a metal oxide semiconductor. The second active layer may be formed of a material that is the same as the material used to form the first active layer.

The panel structure may further include a second thin film transistor (TFT) including a drain electrode connected to the pixel electrode. The drain electrode of the second TFT and the pixel electrode may be connected through a conductive plug formed integral with the pixel electrode. The first conductive layer may be a gate electrode of the second TFT. The first TFT may be a switching transistor and the second TFT may be a driving transistor.

The first connection wire and the pixel electrode may be formed on a same layer.

According to example embodiments, a panel structure may include a transistor including a gate electrode, a source electrode and a drain electrode; a power source line; a pixel electrode; and one or more contact plugs formed of a same material as the pixel electrode and electrically connecting the power source line and the source electrode. The panel structure may further include a connection wire which contacts the one or more contact plugs. The one or more contact plugs may be one or more first contact plugs, and the panel structure may further include one or more second contact plugs integrally formed with the pixel electrode and contacting the drain electrode. The panel structure may further include another transistor electrically connected to the transistor. The panel structure may further include other or more contact plugs connecting the gate electrode of the transistor and a drain electrode of the other transistor. The transistor may be a driving transistor and the other transistor may be a switching transistor. The above described contact plugs may be conductive plugs.

According to example embodiments, a panel structure may include a transistor including a gate electrode, a source electrode and a drain electrode; a pixel electrode; an insulating layer formed over the transistor; and one or more contact plugs integrally formed with the pixel electrode, penetrating the insulating layer and contacting the drain electrode. The one or more contact plugs may be one or more first contact plugs, and the panel structure may further include a power source line; and one or more second contact plugs penetrating the insulating layer and electrically connecting the power source line and the source electrode. The one or more second contact plugs may be formed of a same material as the pixel electrode. The panel structure may further include a connection wire which contacts the one or more second contact plugs. The panel structure may further include another transistor electrically connected to the transistor. The panel structure may further include one or more third contact plugs connecting the gate electrode of the transistor and a drain electrode of the other transistor. The transistor may be a driving transistor and the other transistor may be a switching transistor. The above described contact plugs may be conductive plugs.

According to example embodiments, a panel structure may include a first transistor including a first gate electrode, a first source electrode and a first drain electrode; a second transistor including a second gate electrode, a second source electrode, and a second drain electrode; a pixel electrode; and one or more contact plugs formed of a same material as the pixel electrode and electrically connecting the first drain electrode and the second gate electrode. The first transistor may be a switching transistor and the second transistor may be a driving transistor. The panel structure may further include a connection wire which contacts the one or more contact plugs. The one or more contact plugs may be one or more first contact plugs, and the panel structure may further include one or more second contact plugs integrally formed with the pixel electrode and contacting the second drain electrode. The panel structure may further include a power source line; and other or more contact plugs formed of the same material as the pixel electrode and electrically connecting the power source line and the second source electrode. The panel structure may further include a connection wire which contacts the other or more contact plugs. The above described contact plugs may be conductive plugs.

According to example embodiments, a display device may include the panel structures of example embodiments described above.

According to example embodiments, a method of manufacturing a panel structure including a first thin film transistor (TFT) having a first gate electrode, a first active layer, a first source electrode and a first drain electrode, and a first conductive layer disposed apart from the first drain electrode is provided. The method may include forming a pixel electrode; forming a first contact plug contacting the first drain electrode while forming the pixel electrode; forming a second contact plug contacting the first conductive layer while forming the pixel electrode; and forming a first connection wire contacting the first contact plug and the second contact plug.

Forming of the first connection wire may be performed while forming the pixel electrode. The pixel electrode, the first contact plug, and the second contact plug may be formed of a same material. The first connection wire may be made of a same material as the pixel electrode.

The method may further include forming a second conductive layer spaced apart from the first conductive layer; forming a third conductive layer spaced apart from the second conductive layer; forming a third contact plug contacting the second conductive layer while forming the pixel electrode; forming a fourth contact plug contacting the third conductive layer while forming the pixel electrode; and forming a second connection wire connecting the third contact plug and the fourth contact plug. Forming of the second connection wire may be performed while forming the pixel electrode. The second connection wire may be made of a same material as the pixel electrode. The second conductive layer may be a power source line.

The first conductive layer may be a second gate electrode and the third conductive layer may be a second source electrode, and the method may further include forming a gate insulating layer covering the first gate electrode and the second gate electrode; forming a second active layer on the gate insulating layer; forming a second drain electrode contacting the second active layer; and forming an insulating layer on the gate insulating layer so as to cover the first active layer, the first source electrode, the first drain electrode, the second active layer, the second source electrode, and the second drain electrode, wherein the first and fourth contact plugs may be formed to penetrate the insulating layer, and the second and third contact plugs may be formed to penetrate the insulating layer and the gate insulating layer. The pixel electrode may be formed on the insulating layer so as to be connected to the second drain electrode through a fifth contact plug.

To achieve the above and/or other aspects, example embodiments may include a method of manufacturing a display device including a panel structure, wherein the panel structure may be manufactured by using the method above.

BRIEF DESCRIPTION OF THE DRAWINGS

Example embodiments will be more clearly understood from the following detailed description taken in conjunction with the accompanying drawings. FIGS. 1-5E represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, example embodiments will be described with reference to the attached drawings. In the drawings, the thicknesses of layers and regions are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. In the drawings, the thicknesses of layers and regions may be exaggerated for clarity. Like reference numerals in the drawings denote like elements.

Figure 1:
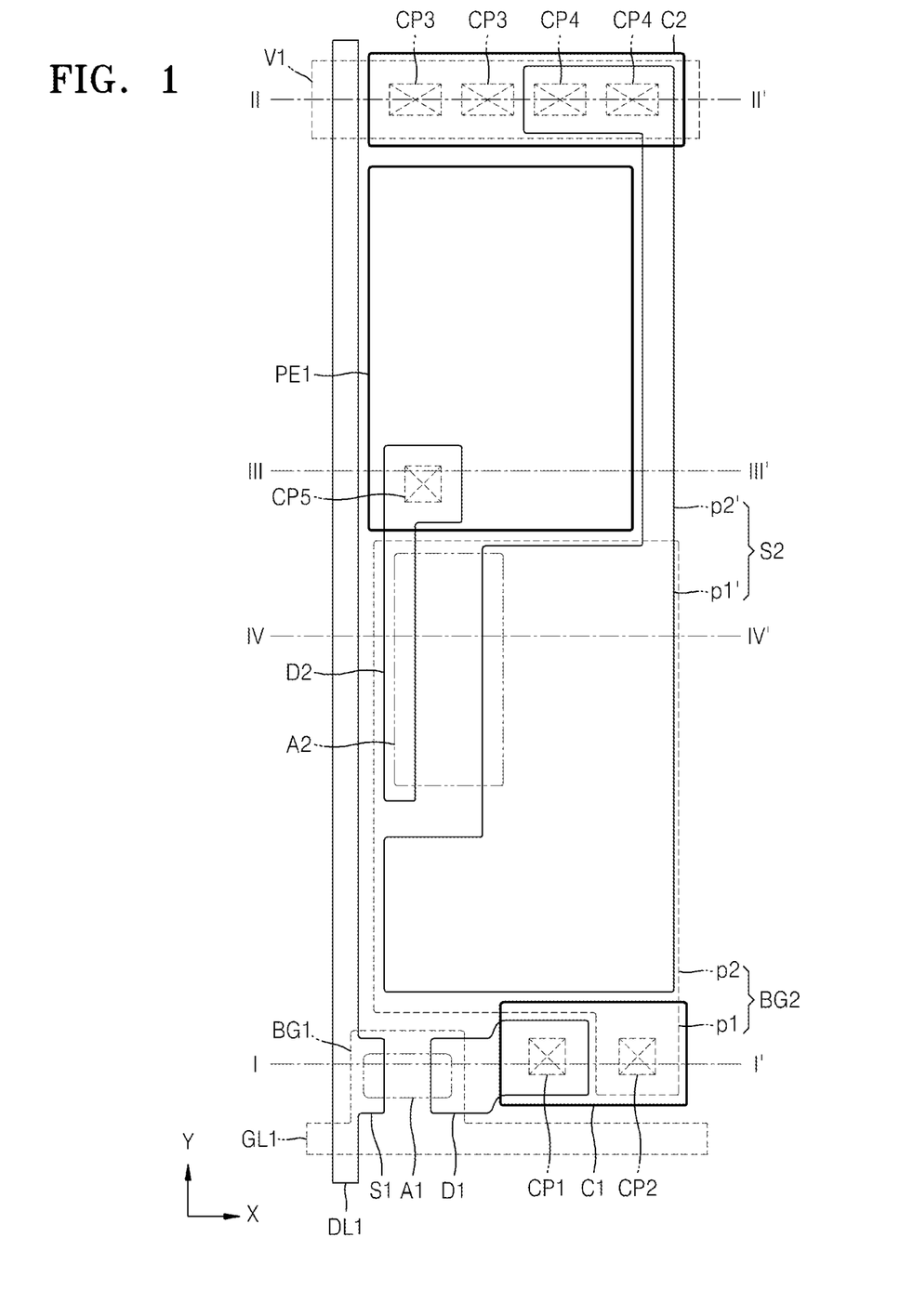
FIG. 1 is a plan view of a panel structure according to example embodiments.

FIG. 1 is a plan view of a panel structure according to example embodiments. Referring to FIG. 1, a first gate line GL1 including a first gate electrode BG1, and a second gate electrode BG2 spaced apart from the first gate line GL1 may be disposed on a substrate (not illustrated). The first gate line GL1 may be extended in a predetermined or given direction, for example, in an X-axis direction, and the first gate electrode BG1 may be a part projected in a Y-axis direction. The second gate electrode BG2 may be spaced apart from the first gate line GL1 in the Y-axis direction by a predetermined or given interval and may include first and second portions p1 and p2. The first portion p1 may be spaced apart from the first gate electrode BG1 in the X-axis direction by a predetermined or given interval and may have a smaller square form.

The second portion p2 may have a larger square form extended from the first portion p1 to the upper side of the first gate electrode BG1 in a direction opposite to the X-axis and extended by a predetermined or given length in the Y-axis direction. The forms of the first gate line GL1 and the second gate electrode BG2 may vary. A power source line V1, which may be spaced apart from the second gate electrode BG2 by a predetermined or given interval, may be further disposed on the substrate. The power source line V1 may be extended in the X-axis direction. The power source line V1 may be spaced apart from the second gate electrode BG2 in the Y-axis direction. Accordingly, the second gate electrode BG2 may be interposed between the power source line V1 and the first gate line GL1.

Although not illustrated in FIG. 1, a gate insulating layer covering the first gate line GL1, the second gate electrode BG2, and/or the power source line V1 may be disposed on the substrate. Materials used to form the gate insulating layer may not be particularly restricted but may be a layer formed of, for example, silicon oxide, silicon nitride, and a high dielectric material (titanium oxide, hafnium oxide and so on). A first active layer A1 may be disposed above the first gate electrode BG1 on the gate insulating layer and a second active layer A2 may be disposed above the second gate electrode BG2 on the gate insulating layer. Materials used to form the first and second active layers A1 and A2 may not be particularly restricted but may be layers formed of, for example, amorphous silicon (a-Si), poly-crystalline silicon (poly-Si), GeSi, GaAs, and metal oxide semiconductor (ZnO, InZnO, GaInZnO, and so on). The second active layer A2 may be disposed on the upper left part of the second portion p2. The second active layer A2 may have the form of a bar extended in the Y-axis direction. A size, a location, and a form of the second active layer A2 may vary.

A first source electrode S1 and a first drain electrode D1 may be disposed to contact both sides of the first active layer A1 respectively on the gate insulating layer. A first data line DL1 extended from the end part of the first source electrode S1 in the Y-axis direction and in the direction opposite to the Y-axis may be further included. In other words, the first source electrode S1 may be a part projected in the X-axis direction from the first data line DL1, which may be extended in the Y-axis direction. Hereinafter, the first source electrode S1 may be regarded as a part of the first data line DL1. The first drain electrode D1 may be extended from the first active layer A1 in the X-axis direction by a predetermined or given length.

The first drain electrode D1 may be interposed between the first gate electrode BG1 and the first portion p1 on the gate insulating layer, and one end of the first drain electrode D1 contacts the first active layer A1. The first drain electrode D1 may have a bent form but the form of the first drain electrode D1 may vary. The first gate line GL1 including the first gate electrode BG1, the gate insulating layer, the first active layer A1, the first data line DL1 including the first source electrode S1, and the first drain electrode D1 may form a first thin film transistor (TFT). The first TFT may be a switching transistor.

A second source electrode S2 and a second drain electrode D2 may be disposed to contact both sides of the second active layer A2 respectively on the gate insulating layer. The second source electrode S2 may be divided into a first portion p1' and a second portion p2'. The first portion p1' may be disposed above the second portion p2 of the second gate electrode BG2 and may be extended rightward and downward of the second active layer A2. The second portion p2' may be out of the range of the second gate electrode BG2, when viewed from the top side, and one end of the second portion p2' may be disposed above the power source line V1. For example, the second portion p2' may be extended from the upper right part of the first portion p1' to the power source line V1 in the Y-axis direction and extended in the direction opposite to the X-axis direction by a predetermined or given length above the power source line V1.

The second drain electrode D2 may contact one end of the second active layer A2 and may be extended from the second active layer A2 to the upper side, for example, in the Y-axis direction, by a predetermined or given length. The extended part of the second drain electrode D2 may have a larger width than that of the remaining part of the second drain electrode D2. The second gate electrode BG2, the gate insulating layer, the second active layer A2, the second source electrode S2, and the second drain electrode D2 may form a second TFT. The second TFT may be a driving transistor.

Although not illustrated in FIG. 1, an insulating layer covering the first active layer A1, the first data line DL1 including the first source electrode S1, the first drain electrode D1, the second active layer A2, the second source electrode S2, and the second drain electrode D2 may be disposed on the gate insulating layer. The insulating layer may be a passivation layer and may include at least one of silicon oxide, silicon nitride, and other insulating materials.

First and second connection wires C1 and C2 may be disposed on the insulating layer. The first connection wire C1 may be an element for electrically connecting the first drain electrode D1 and the second gate electrode BG2. One end of the first connection wire C1 may be connected to the first drain electrode D1 and the other end of the first connection wire C1 may be connected to the first portion p1 of the second gate electrode BG2. The one end of the first connection wire C1 and the first drain electrode D1 may be electrically connected to each other by at least one first conductive plug CP1 penetrating the insulating layer. The other end of the first connection wire C1 and the first portion p1 of the second gate electrode BG2 may be electrically connected to each other by at least one second conductive plug CP2 penetrating the gate insulating layer and the insulating layer. The second connection wire C2 may be an element for electrically connecting the power source line V1 and one end of the second source electrode S2 and may be disposed above the power source line V1.

One end of the second connection wire C2 may be connected to the power source line V1 and the other end of the second connection wire C2 may be connected to the one end of the second source electrode S2. The one end of the second connection wire C2 and the power source line V1 may be electrically connected to each other by at least one third conductive plug CP3 penetrating the gate insulating layer and the insulating layer. The other end of the second connection wire C2 and the one end of the second source electrode S2 may be electrically connected to each other by at least one fourth conductive plug CP4 penetrating the insulating layer.

In addition, a conductive element, for example, a pixel electrode PE1, which may be electrically connected to the second drain electrode D2 may be further disposed on the insulating layer. The pixel electrode PE1 may be formed of at least one of a metal oxide and a metal and may be transparent or opaque. For example, the metal oxide for forming the pixel electrode PE1 may be at least one of indium tin oxide (ITO), indium zinc oxide (IZO), Sn oxide, In oxide, Zn oxide, and a mixture thereof. The metal oxide, e.g., zinc (Zn) oxide, may have a conductor or semiconductor characteristic according to the composition of the metal oxide. Zinc (Zn) oxide, which may be used as the pixel electrode PE1, may have a conductor characteristic.

The first and second connection wires C1 and C2 may be formed of the material that may be same as the material used to form the pixel electrode PE1. In addition, the first through fourth conductive plugs CP1 through CP4 and a fifth conductive plug CP5, which will be described later, may be formed of the material that may be same as the material for forming the pixel electrode PE1. The pixel electrode PE1 may be connected to the extended part of the second drain electrode D2 by at least one fifth conductive plug CP5 penetrating the insulating layer. The pixel electrode PE1 may be interposed between the second gate electrode BG2 and the power source line V1 and between the first data line DL1 and the second source electrode S2 on the insulating layer. Although not illustrated in FIG. 1, a predetermined or given light emitting device, for example, an organic light emitting device, may be formed on the pixel electrode PE1.

A part of the second gate electrode BG2, a part of the second source electrode S2 corresponding thereto, and the gate insulating layer between the part of the second gate electrode BG2 and the part of the second source electrode S2 may function as a capacitor. In other words, a part of the driving transistor may function as a capacitor. Thus, the panel structure according to example embodiments may be a 2T (transistors)-1C (capacitor) structure. The switching transistor, for example, the first TFT formed of the first gate line GL1, the gate insulating layer, the first active layer A1, the first data line DL1, and the first drain electrode D1, wherein the first gate line GL1 may include the first gate electrode BG1 and the first data line DL1 may include the first source electrode S1, may be turned on, a current may be applied to the second gate electrode BG2 through the first drain electrode D1. When the current may be applied to the second gate electrode BG2 and a predetermined or given voltage may be applied to the power source line V1, the driving transistor may be turned on and a current may be applied to the pixel electrode PE1 through the second drain electrode D2. The capacitor may maintain the current applied to the pixel electrode PE1 for a predetermined or given period of time. The light emitting device (not illustrated) disposed on the pixel electrode PE1 may be operated by the current applied to the pixel electrode PE1.

Figure 2:
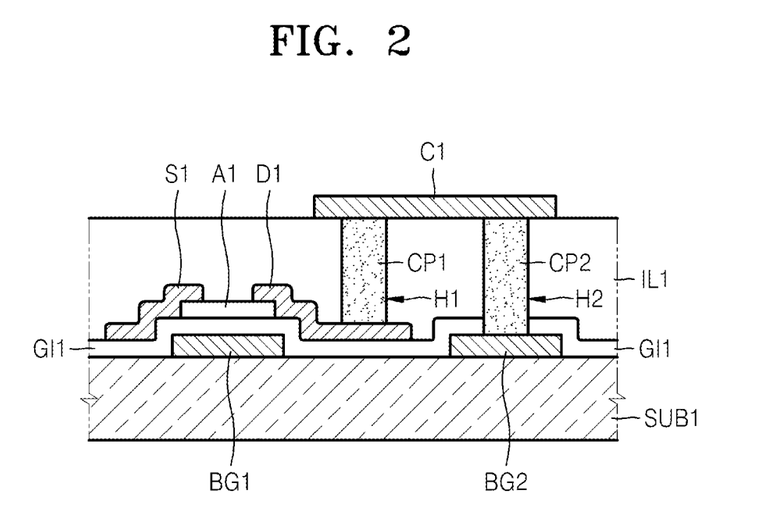
FIGS. 2 and 3A-3C are cross-sectional views of the panel structures of FIG. 1 respectively taken along the lines I-I', II-II', III-III' and IV-IV' of FIG. 1.

FIG. 2 is a cross-sectional view of the switching transistor of the panel structure of FIG. 1 taken along the line I-I' of FIG. 1. Referring to FIG. 2, the first and second gate electrodes BG1 and BG2 which may be spaced apart from each other may be disposed on a substrate SUB1. A gate insulating layer GI1 covering the first and second gate electrodes BG1 and BG2 may be disposed on the substrate SUB1. The first active layer A1 may be disposed on the gate insulating layer GI1, wherein the gate insulating layer GI1 may be formed above the first gate electrode BG1. The first source electrode S1 and the first drain electrode D1 contacting both sides of the first active layer A1 may be disposed on the gate insulating layer GI1. An insulating layer IL1 covering the first active layer A1, the first source electrode S1, and the first drain electrode D1 may be disposed on the gate insulating layer GI1. At least one first hole H1 exposing the first drain electrode D1 may be included in the insulating layer IL1. Also, at least one second hole H2 exposing the second gate electrode BG2 may be included in the insulating layer IL1 and the gate insulating layer GI1. The first conductive plug CP1 may be included in the first hole H1 and the second conductive plug CP2 may be included in the second hole H2. The first connection wire C1 connecting the first conductive plug CP1 and the second conductive plug CP2 may be formed on the insulating layer IL1. Accordingly, the first drain electrode D1 and the second gate electrode BG2 may be electrically connected to each other by the first connection wire C1, the first conductive plug CP1, and the second conductive plug CP2.

Figure 3A:
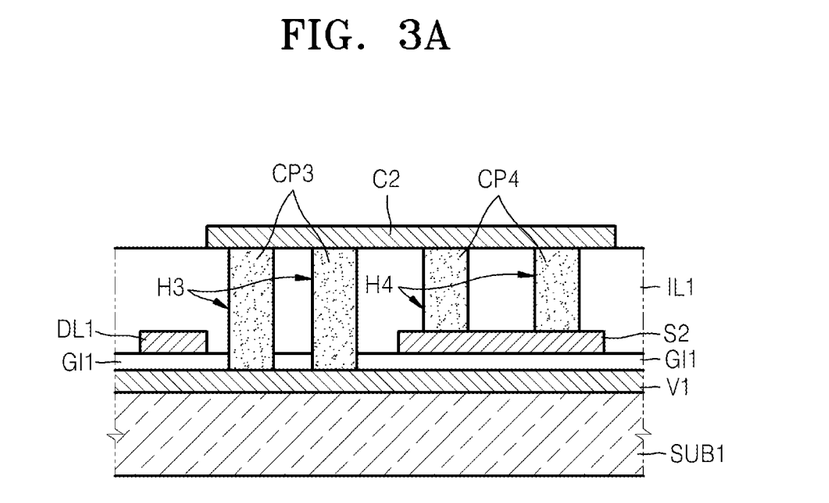

FIG. 3A is a cross-sectional view of the power supplier of the panel structure of FIG. 1 taken along the line II-II' of FIG. 1. Referring to FIG. 3A, the power source line V1 may be formed on the substrate SUB1 and the gate insulating layer GI1 may cover the power source line V1. The first data line DL1 and the second source electrode S2 which may be spaced apart from each other may be disposed on the gate insulating layer GI1. The insulating layer IL1 may be disposed to cover the first data line DL1 and the second source electrode S2. At least one third hole H3 exposing the power source line V1 may be included in the insulating layer IL1 and the gate insulating layer GI1. At least one fourth hole H4 exposing the second source electrode S2 may be included in the insulating layer IL1. The third conductive plug CP3 may be included in the third hole H3 and the fourth conductive plug CP4 may be included in the fourth hole H4. The second connection wire C2 connecting the at least one third conductive plug CP3 and the at least one fourth conductive plug CP4 may be disposed on the insulating layer IL1. Accordingly, the power source line V1 and the second source electrode S2 may be electrically connected to each other by the second connection wire C2, the at least one third conductive plug CP3, and the at least one fourth conductive plug CP4.

The first through fourth holes H1 through H4 according to example embodiments may be simultaneously formed by performing one etching process. For example, the via holes H1 through H4 for vertical connection may be simultaneously formed by performing one lithography process using one mask. When the insulating layer IL1 may be etched to form the first and fourth holes H1 and H4, the first drain electrode D1 and the second source electrode S2 may be etch stopping layers. When the insulating layer IL1 and the gate insulating layer GI1 may be etched to form the second and third holes H2 and H3, the second gate electrode BG2 and the power source line V1 may be etch stopping layers. As such, the first through fourth holes H1 through H4 may be simultaneously formed by performing one etching process so that a manufacturing process may be simplified and manufacturing costs may be reduced.

Figure 3B:
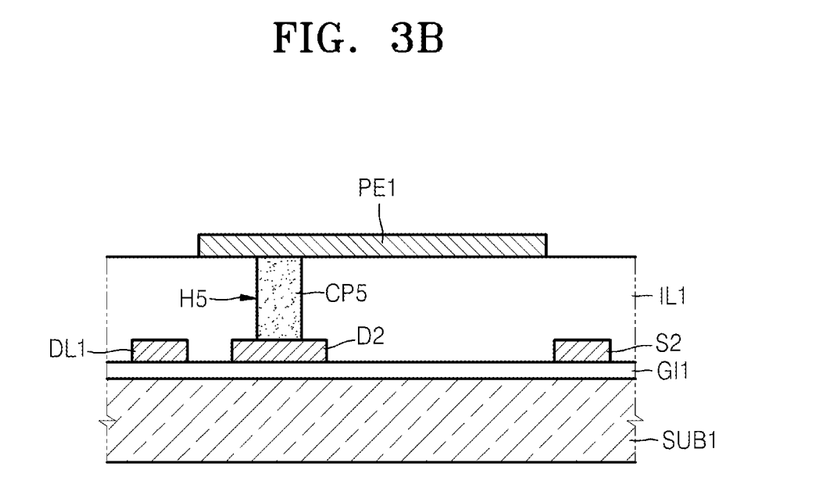
Figure 3C:
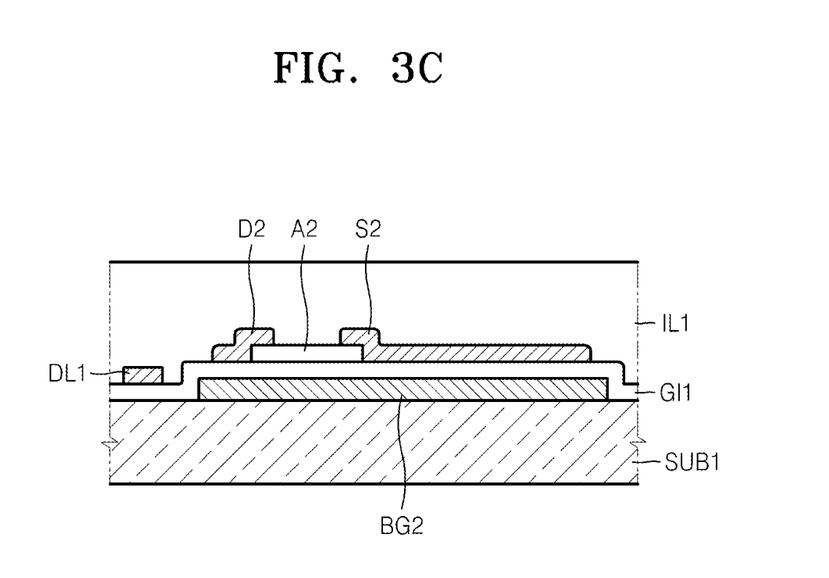

FIGS. 3B-3C are cross-sectional views of the pixel electrode and the driving transistor of the panel structure of FIG. 1 taken along the lines III-III' and IV-IV', respectively, of FIG. 1. Referring to FIG. 3B, the gate insulating layer GI1 may be formed on the substrate SUB1. The first data line DL1, the second drain electrode D2 and the second source electrode S2, which are spaced apart from each other, may be disposed on the gate insulating layer GI1. The insulating layer IL1 may be disposed to cover the first data line DL1, the second drain electrode D2 and the second source electrode S2. At least one fifth hole H5 exposing the second drain electrode D2 may be included in the insulating layer IL1. The fifth conductive plug CP5 may be included in the fifth hole H5. The pixel electrode PE1, connected to the at least one fifth conductive plug CP5, may be disposed on the insulating layer IL1.

Referring to FIG. 3C, a gate insulating layer GI1 covering the second gate electrode BG2 may be disposed on the substrate SUB1. The second active layer A2 may be disposed on the gate insulating layer GI1, wherein the gate insulating layer GI1 may be formed above the second gate electrode BG2. The second source electrode S2 and the second drain electrode D2 contacting both sides of the second active layer A2 may be disposed on the gate insulating layer GI1. The first data line DL1 and the second source electrode S2, which are spaced apart from each other, may be disposed on the gate insulating layer GI1. An insulating layer IL1 covering the second active layer A2, the second source electrode S2, and the second drain electrode D2 may be disposed on the gate insulating layer GI1.

The first through fourth holes H1 through H5 according to example embodiments may be simultaneously formed by performing one etching process. For example, the via holes H1 through H5 for vertical connection may be simultaneously formed by performing one lithography process using one mask. When the insulating layer IL1 may be etched to form the first, fourth and fifth holes H1, H4 and H5, the first drain electrode D1, the second source electrode S2 and the second drain electrode D2 may be etch stopping layers. When the insulating layer IL1 and the gate insulating layer GI1 may be etched to form the second and third holes H2 and H3, the second gate electrode BG2 and the power source line V1 may be etch stopping layers. As such, the first through fifth holes H1 through H5 may be simultaneously formed by performing one etching process so that a manufacturing process may be simplified and manufacturing costs may be reduced.

The above example embodiments may vary. For example, in FIG. 2, the first gate electrode BG1 and the second gate electrode BG2 may be formed on the same layer. However, the first gate electrode BG1 and the second gate electrode BG2 may be disposed on layers that may be different from each other. In addition, the second gate electrode BG2 may be replaced with a conductive layer, instead of a gate of the transistor. Similarly, the second source electrode S2 and the power source line V1 shown in FIG. 3A may be replaced with conductive layers having different functions.

Figure 4:
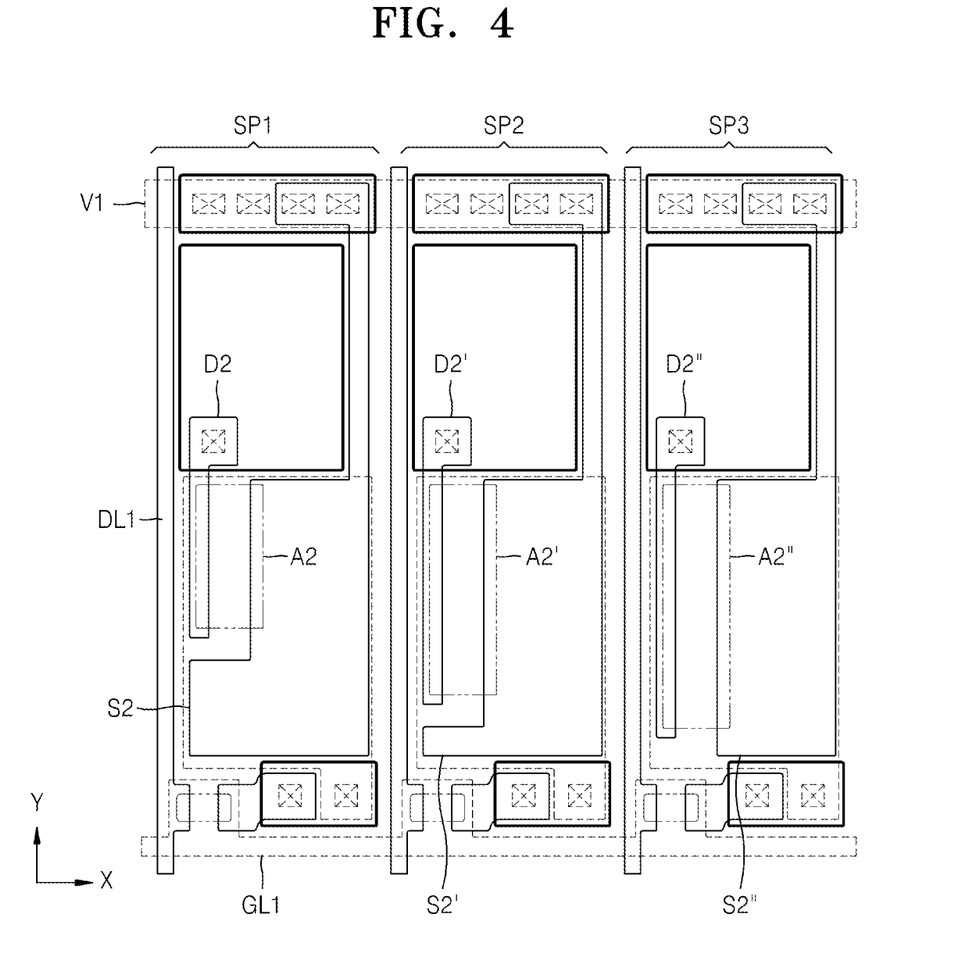
FIG. 4 is a plan view of a panel structure according to example embodiments.

The structure shown in FIG. 1 may correspond to one sub-pixel region. For example, a light emitting unit (for example, an organic light emitting unit) displaying at least one of red, green, and blue colors may be disposed on the pixel electrode PE1 of FIG. 1. Thus, the panel structure according to example embodiments may include a plurality of panel structures similar to the panel structure of FIG. 1. FIG. 4 is a plan view of the panel structure according to example embodiments.

Referring to FIG. 4, three unit devices (hereinafter, referred to as first through third unit devices SP1 through SP3) that may be similar to the panel structure shown in FIG. 1 may be sequentially arranged in the X-axis direction. The first through third unit devices SP1 through SP3 may respectively correspond to a red sub-pixel region, a green sub-pixel region, and a blue sub-pixel region. The first through third unit devices SP1 through SP3 may have similar structures to each other and may share the first gate line GL1 and the power source line V1. However, sizes of second active layers A2, A2', and A2" respectively may be included in the first through third unit devices SP1 through SP3 may be different to each other.

For example, the second active layer A2' of the second unit device SP2 may be longer than the second active layer A2 of the first unit device SP1, and the second active layer A2" of the third unit device SP3 may be longer than the second active layer A2' of the second unit device SP2. This may be because light emitting efficiency of the red organic light emitting unit may be higher than that of the green organic light emitting unit, and light emitting efficiency of the green organic light emitting unit may be higher than that of the blue organic light emitting unit. For example, as light emitting efficiency increases, a size of the second active layer may be small. According to the sizes of the second active layers A2, A2', and A2", sizes and forms of second source electrodes S2, S2', and S2" and second drain electrodes D2, D2', and D2" corresponding to the second active layers A2, A2', and A2" may vary. The structure shown in FIG. 4 may be repeated in the X-axis and Y-axis directions.

Although not illustrated, a display device including the panel structure of FIG. 1 and FIG. 4 may be realized. In the display device, elements other than the panel structure may be similar to existing elements and thus detailed descriptions of the elements will be omitted here.

Figure 5A:
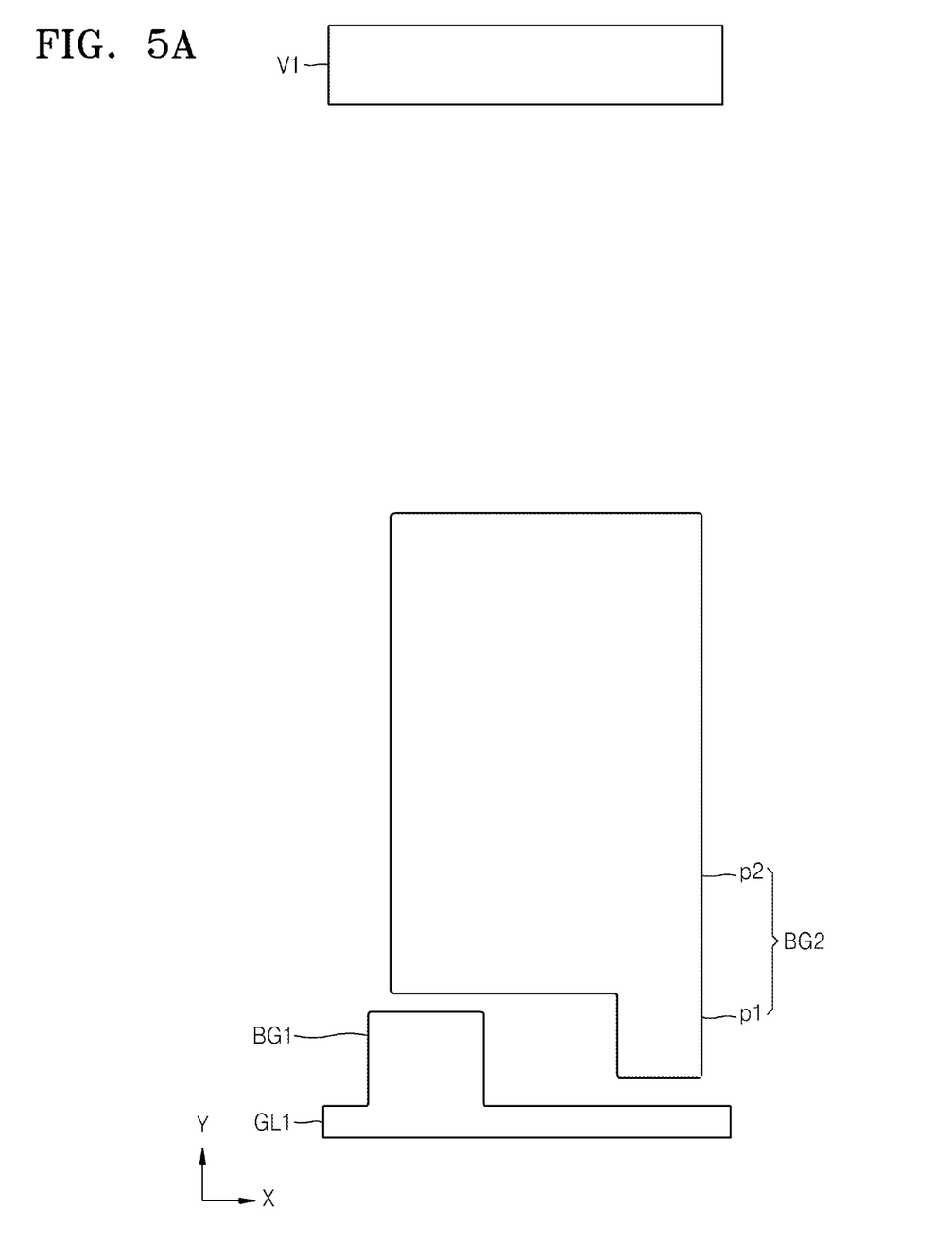
FIGS. 5A-5E are plan views illustrating a method of manufacturing a panel structure according to example embodiments.

FIGS. 5A through 5E are plan views illustrating a method of manufacturing the panel structure of FIG. 1 according to example embodiments. Referring to FIG. 5A, a first gate line GL1, a second gate electrode BG2, and a power source line V1, wherein the first gate line GL1 may include a first gate electrode BG1, may be formed on the substrate (not illustrated) using a first mask (not illustrated). The first gate line GL1 may be extended in a predetermined or given direction, for example, in the X-axis direction, and the first gate electrode BG1 may be a partly projected in the Y-axis direction. The second gate electrode BG2 may be spaced apart from the first gate line GL1 by a predetermined or given interval in the Y-axis direction. The second gate electrode BG2 may include first and second portions p1 and p2 and the forms of the first and second portions p1 and p2 may be the same as described with reference to FIG. 1. The power source line V1 may be spaced apart from the second gate electrode BG2 in the Y-axis direction and may be extended in the X-axis direction. Thus, the second gate electrode BG2 may be interposed between the power source line V1 and the first gate line GL1.

Figure 5B:
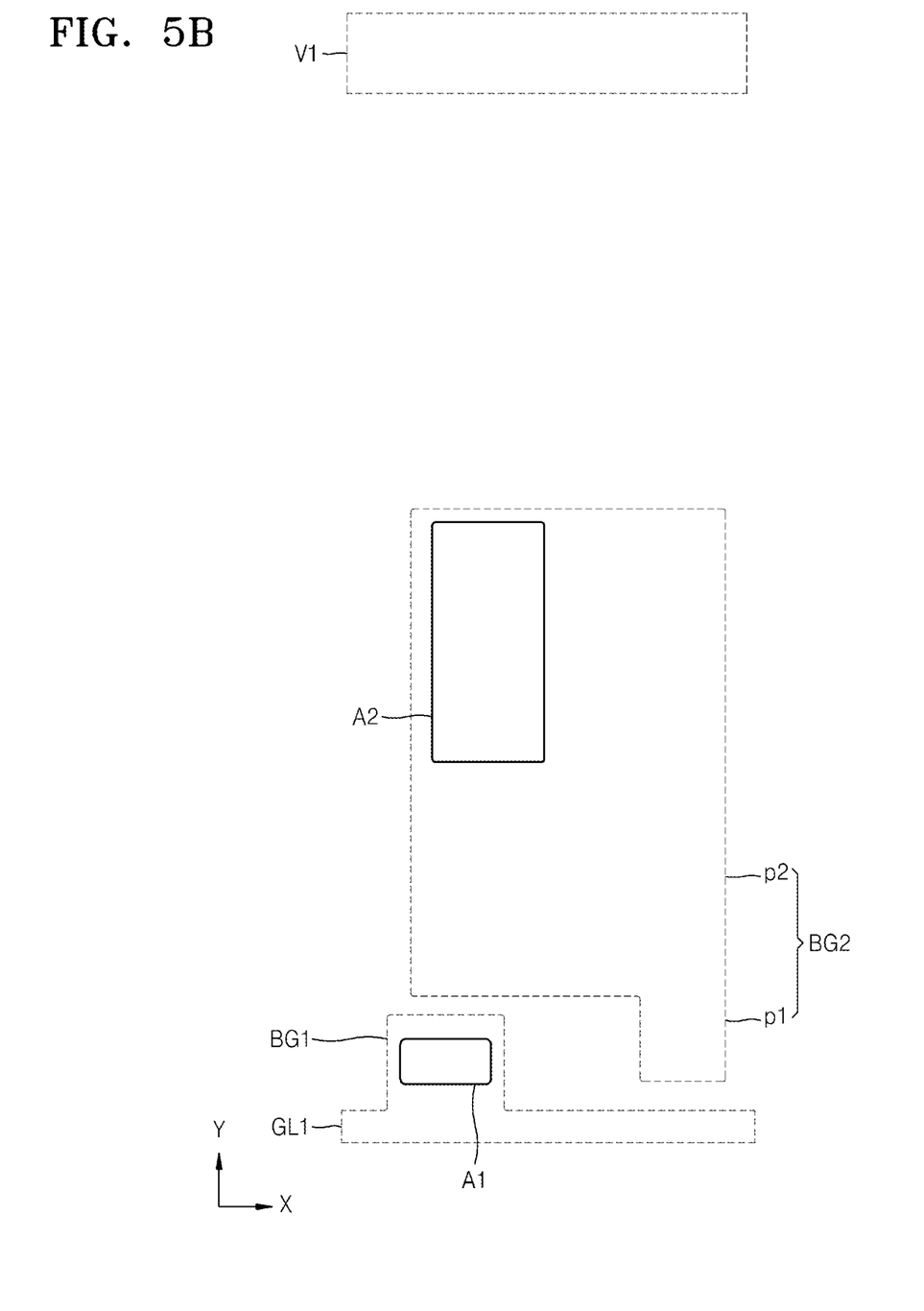

Referring to FIG. 5B, a gate insulating layer (not illustrated) covering the first gate line GL1, the second gate electrode BG2, and the power source line V1 may be formed on the substrate. Materials used to form the gate insulating layer may not be particularly restricted but may be a layer formed of, for example, silicon oxide, silicon nitride, and a high dielectric material (titanium oxide, hafnium oxide, and so on). First and second active layers A1 and A2 may be formed on the gate insulating layer using a second mask (not illustrated). The first and second active layers A1 and A2 may be respectively formed on the gate insulating layer disposed above the first and second gate electrodes BG1 and BG2. The second active layer A2 may be disposed on the upper left part of the second portion p2. The second active layer A2 may have the form of a bar extended in the Y-axis direction. A size, a location, and a form of the second active layer A2 may vary. Forming materials of the first and second active layers A1 and A2 may not be particularly restricted but may be layers formed of, for example, amorphous silicon (a-Si), poly-crystalline silicon (poly-Si), GeSi, GaAs, metal oxide semiconductor (ZnO, InZnO, GaInZnO and so on).

Figure 5C:
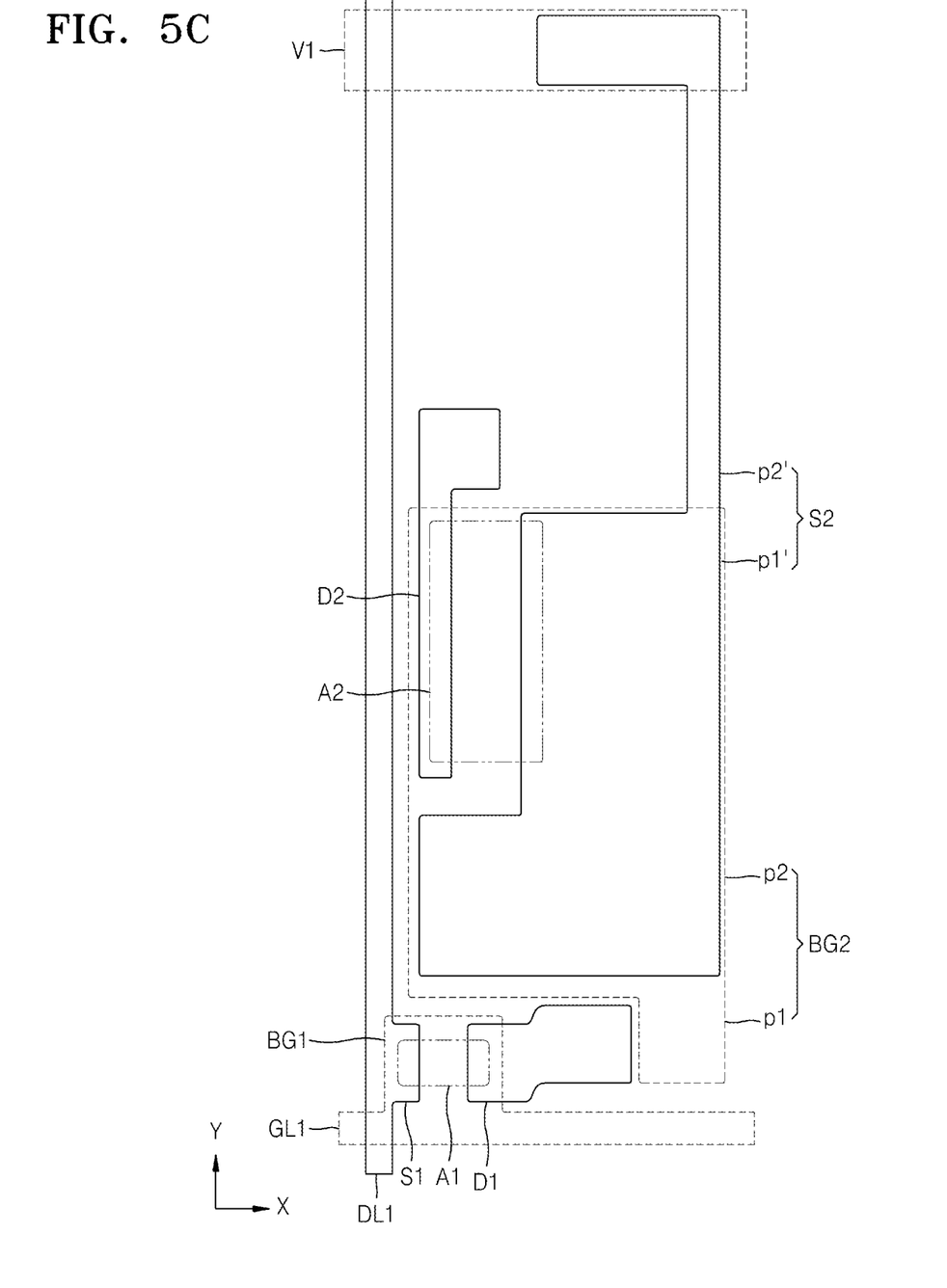

Referring to FIG. 5C, a first data line DL1, a first drain electrode D1, a second source electrode S2, and a second drain electrode D2, wherein the first data line DL1 may include a first source electrode S1, may be formed using a third mask (not illustrated). The first source electrode S1 and the first drain electrode D1 may be disposed to respectively contact both sides of the first active layer A1. The second source electrode S2 and the second drain electrode D2 may be disposed to respectively contact both sides of the second active layer A2. Forms of the first data line DL1, the first drain electrode D1, the second source electrode S2, and the second drain electrode D2 may be the same as those described in FIG. 1. p1' and p2' indicate the first and second portions p1' and p2' included in the second source electrode S2 as illustrated in FIG. 1.

Figure 5D:
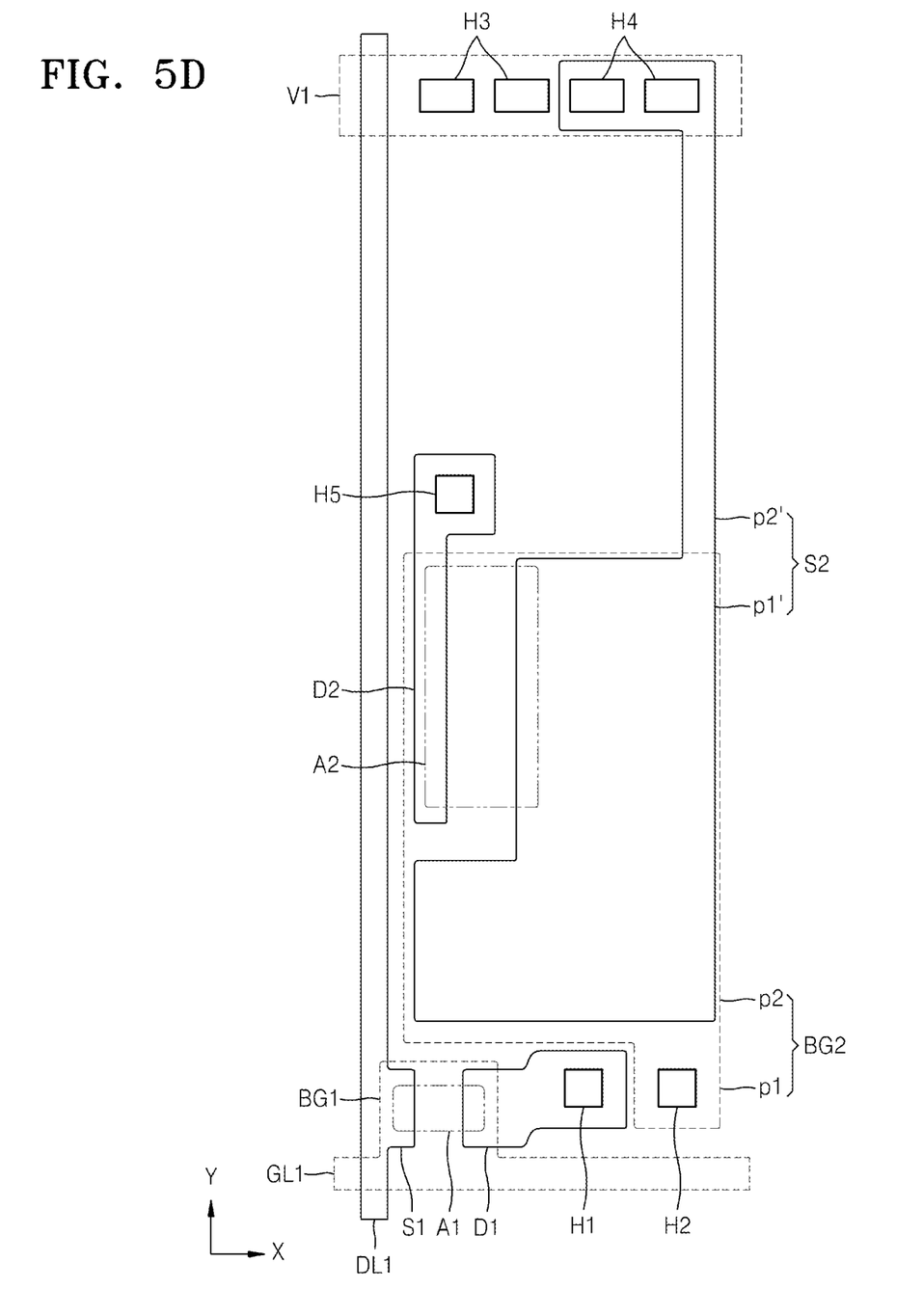

Referring to FIG. 5D, an insulating layer (not illustrated) covering the first active layer A1, the first data line DL1, the first drain electrode D1, the second active layer A2, the second source electrode S2, and the second drain electrode D2, wherein the first data line DL1 may include the first source electrode S1 may be formed on the gate insulating layer. The insulating layer may be a passivation layer and may be formed of at least one of silicon oxide, silicon nitride, and other insulating materials.

First through fifth holes H1 through H5 may be formed using a fourth mask (not illustrated). The first hole H1, the fourth hole H4, and the fifth hole H5 may be formed by etching the insulating layer. The second hole H2 and the third hole H3 may be formed by etching the insulating layer and the gate insulating layer. When the insulating layer may be etched to form the first hole H1, the fourth hole H4, and the fifth hole H5, the first drain electrode D1, the second source electrode S2, and the second drain electrode D2 may be etch stopping layers. When the insulating layer and the gate insulating layer may be etched to form the second hole H2 and the third hole H3, the second gate electrode BG2 and the power source line V1 may be etch stopping layers.

Figure 5E:
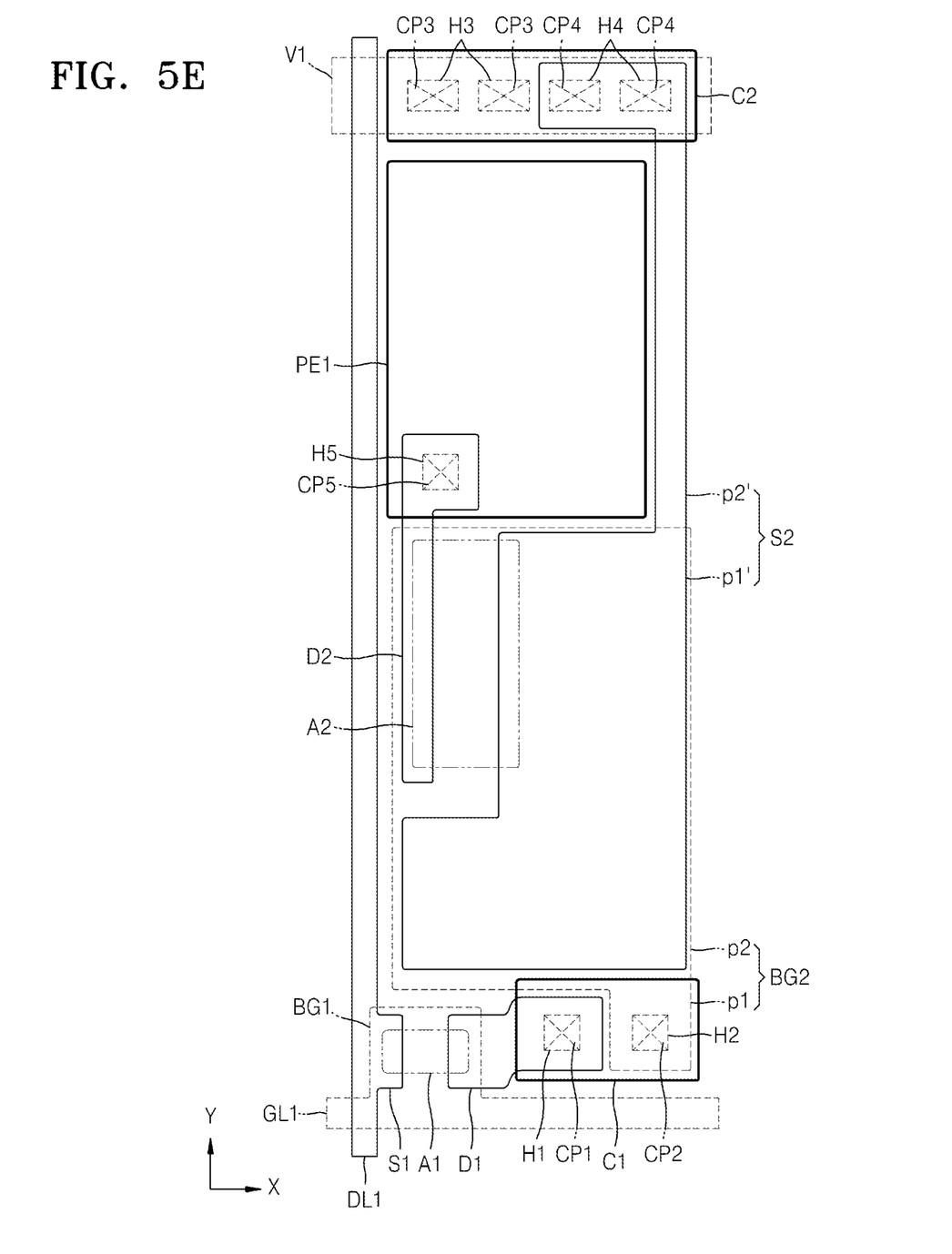

Referring to FIG. 5E, a conductive layer filling the first through fifth holes H1 through H5 may be formed on the insulating layer and the conductive layer may be patterned using a fifth mask (not illustrated), thereby forming first through fifth conductive plugs CP1 through CP5, a first connection wire C1, a second connection wire C2, and a pixel electrode PE1. Accordingly, the first through fifth conductive plugs CP1 through CP5, the first connection wire C1, the second connection wire C2, and the pixel electrode PE1 may be formed of the same material. For example, the first through fifth conductive plugs CP1 through CP5, the first connection wire C1, the second connection wire C2, and the pixel electrode PE1 may be formed of at least one of a metal oxide and a metal and may be transparent or opaque. The metal oxide may be at least one of indium tin oxide (ITO), indium zinc oxide (IZO), Sn oxide, In oxide, Zn oxide, and a mixture thereof. One end and another end of the first connection wire C1 may be respectively connected to the first drain electrode D1 and the second gate electrode BG2 by the first conductive plug CP1 and the second conductive plug CP2.

One end and another end of the second connection wire C2 may be respectively connected to the power source line V1 and the second source electrode S2 by the third conductive plug CP3 and the fourth conductive plug CP4. The pixel electrode PE1 may be connected to the second drain electrode D2 by the fifth conductive plug CP5. Instead of using a single deposition process illustrated in FIG. 5E, the first through fifth conductive plugs CP1 through CP5 filling the first through fifth holes H1 through H5 may be first formed by a first deposition process and the first connection wire C1, the second connection wire C2, and the pixel electrode PE1 may be formed by a second deposition process.

As described above, because the first through fifth holes H1 through H5, for example, the via holes, may be formed by performing one process, the panel structure may be manufactured using only five masks. Thus, a manufacturing process may be simplified and manufacturing costs may be reduced, compared with the related art.

Although not illustrated, the display device may be realized from the panel structure manufactured using the method illustrated in FIGS. 5A through 5E. Elements other than the panel structure may be similar to existing elements and thus detailed descriptions thereof will be omitted here.

It should be understood that example embodiments described herein should be considered in a descriptive sense only and not for purposes of limitation. For example, it would have been obvious to one of ordinary skill in the art to diversify the elements of the panel structure and to vary the structure of the panel structure. For example, the panel structure according to example embodiments may be a 2T(transistors)-1C(capacitor) structure but the number of the transistors and capacitors may vary. For example, various modifications, e.g., a 5T-2C structure and a 3T-1C structure may be used. In addition, a part of or the whole panel structure according to example embodiments may be applied to a display device other than the organic light emitting display device, for example, a liquid crystal display (LCD) device, and to other electronic devices other than a display device. Therefore, it will be understood that various changes in form and details may be made therein without departing from the spirit and scope of the following claims.

What is claimed is:

1. A panel structure, comprising:
   a transistor including a gate electrode, a source electrode and a drain electrode;
   a power source line;
   a pixel electrode;
   one or more contact plugs formed of a same material as the pixel electrode and electrically connecting the power source line and the source electrode; and
   a connection wire which contacts the one or more contact plugs.

2. The panel structure of claim 1, wherein the one or more contact plugs are one or more first contact plugs, and the panel structure further comprises one or more second contact plugs integrally formed with the pixel electrode and contacting the drain electrode.

3. The panel structure of claim 1, further comprising:
   another transistor electrically connected to the transistor.

4. The panel structure of claim 3, further comprising:
   other or more contact plugs connecting the gate electrode of the transistor and a drain electrode of the other transistor.

5. The panel structure of claim 3, wherein the transistor is a driving transistor and the other transistor is a switching transistor.

* * * * *